United States Patent
Tanjo et al.

[11] Patent Number: 6,127,806
[45] Date of Patent: Oct. 3, 2000

[54] STATE OF CHARGE INDICATOR

[75] Inventors: Yuji Tanjo; Toyoaki Nakagawa; Hideaki Horie; Takaaki Abe; Ken Iwai; Mikio Kawai, all of Kanagawa, Japan

[73] Assignee: Nissan Motor Co., Ltd., Yokohama, Japan

[21] Appl. No.: 09/311,884

[22] Filed: May 14, 1999

[30] Foreign Application Priority Data

May 14, 1998  [JP]  Japan .................................. 10-132183

[51] Int. Cl.$^7$ .............................. H02J 7/00; G01N 27/416
[52] U.S. Cl. ......................... 320/132; 324/432; 324/433
[58] Field of Search ........................... 320/132; 324/432, 324/433

[56] References Cited

U.S. PATENT DOCUMENTS

| | | | |
|---|---|---|---|
| 5,160,880 | 11/1992 | Palanisamy | 320/106 |
| 5,321,627 | 6/1994 | Reher | 702/63 |
| 5,352,968 | 10/1994 | Reni et al. | 320/136 |
| 5,381,096 | 1/1995 | Hirzel | 324/427 |
| 5,539,318 | 7/1996 | Sasaki | 324/428 |
| 5,561,362 | 10/1996 | Kawamura et al. | 320/134 |
| 5,821,756 | 10/1998 | McShane | 324/430 |

FOREIGN PATENT DOCUMENTS

10-38985  2/1998  Japan.

*Primary Examiner*—Peter S. Wong
*Assistant Examiner*—Gregory J. Toatley, Jr.
*Attorney, Agent, or Firm*—Foley & Lardner

[57] ABSTRACT

A state of charge indicator of a lithium ion battery computes a state of charge (SOC) corresponding to a cell open circuit voltage from a SOC-cell open circuit voltage characteristic map, and displays the SOC on a display device. Herein, the SOC-cell open circuit voltage characteristics are obtained by defining the battery charge amount when the open circuit voltage of the cell is 3.9 V as SOC=100%, and defining the battery charge amount when the open circuit voltage of the cell is 3.5 V as SOC=100%. By defining SOC=100% and SOC=0% in this way, the SOC can be correctly computed and displayed even if the battery has deteriorated.

9 Claims, 10 Drawing Sheets

STATE OF CHARGE INDICATOR

FIELD OF THE INVENTION

The present invention relates to a state of charge indicator which detects and displays the state of charge (SOC) of a battery.

BACKGROUND OF THE INVENTION

Tokkai Hei 10-38985 published by the Japanese Patent Office in 1998 discloses a device which detects and displays the SOC of a battery based on the open circuit voltage of the battery.

SUMMARY OF THE INVENTION

The capacity of a battery decreases as the battery deteriorates. Therefore, the difference between the displayed SOC and actual SOC becomes large as the battery deteriorates if the SOC is calculated in reference to the voltage data of a new battery, i.e., the voltage when it is fully charged and the voltage when it is fully discharged.

In order to eliminate such SOC errors, SOC must be calculated in reference to voltage data obtained from the battery in use. However, in hybrid vehicles equipped with an engine and a motor as a source of motive power, charging/discharging is controlled so that the SOC is within a predetermined range, and the battery is never in a full charge state or a full discharge state.

It is therefore an object of this invention to correctly detect and display the SOC of a battery even if the battery deteriorates.

In order to achieve the above object, this invention provides a state of charge indicator for a lithium ion battery comprising plural cells connected in series. The indicator comprises a display device, a sensor for detecting an open circuit voltage of the battery, and a microprocessor. The microprocessor is programmed to compute an open circuit voltage of the cell based on the detected battery open circuit voltage, compute an SOC corresponding to the computed cell open circuit voltage from an SOC-cell open circuit voltage characteristic map obtained by defining the battery charge amount when the open circuit voltage of the cell is 3.9 V as SOC 100%, and defining the battery charge amount when the open circuit voltage of the cell is 3.5 V as SOC 0%, and display the computed SOC on the display device.

The details as well as other features and advantages of this invention are set forth in the remainder of the specification and are shown in the accompanying drawings.

DESCRIPTION OF THE PREFERRED EMBODIMENTS

Figure 1:
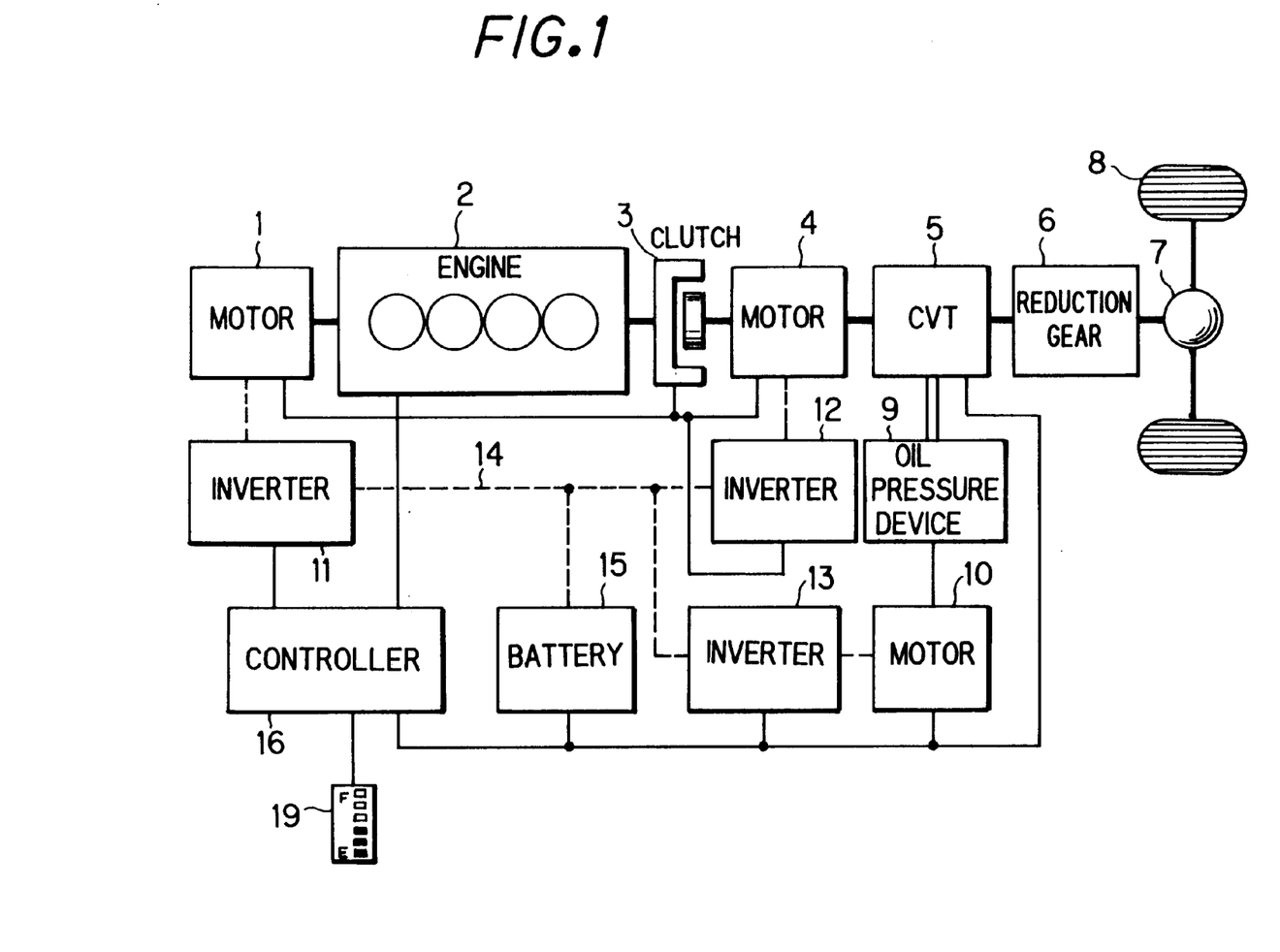
FIG. 1 is a schematic diagram of a hybrid vehicle equipped with an SOC indicator according to this invention.

Referring to FIG. 1 of the drawings, a vehicle is equipped with a motor 1, engine 2, clutch 3, motor 4, Continuously Variable Transmission (CVT) 5, reduction gear 6, differential device 7, and drive wheels 8. The thick solid line in the figure shows the transmission route over which mechanical force is transmitted, and the thick broken line represents a power line. The thin solid line represents a control line and the double line indicates an oil pressure system.

The output shaft of the motor 1, output shaft of the engine 2, and the input shaft of a clutch 3 are interconnected, and the output shaft of the clutch 3, output shaft of the motor 4 and input shaft of the CVT 5 are interconnected.

When the clutch 3 is engaged, the engine 2 and motor 4 drive the vehicle, and when the clutch 3 is released, only the motor 4 drives the vehicle. The drive force of the engine 2 and/or the motor 4 is transmitted to the drive wheels 8 via the CVT 5, reduction gear 6 and differential device 7. Oil pressure is applied to the CVT 5 from an oil pressure device 9. An oil pump of the oil pressure device 9, not illustrated, is driven by a motor 10.

The motors 1, 4 and 10 are AC motors such as a three phase synchronous motor or a three phase induction motor. The motor 1 is mainly used for starting the engine 2 and power generation. The motor 4 is mainly used for driving and regenerative braking the vehicle. The motor 10 drives the oil pump of the oil pressure device 9.

A direct current motor can also be used as the motors 1, 4 and 10. It is also possible to use the motor 1 for driving and regenerative braking of the vehicle or use the motor 4 for engine startup and power generation when the clutch 3 is engaged.

The clutch 3 is a powder clutch and can adjust the transmission torque. A dry type single plate clutch or a wet multi-plate clutch can also be used as the clutch 3. The CVT 5 is a belt type CVT or toroidal type CVT which can continuously adjust the speed ratio.

The motors 1, 4 and 10 are respectively driven by the inverters 11, 12 and 13. When using a direct current motor as the motors 1, 4 and 10, DC/DC converters are used instead of inverters. The inverters 11, 12 and 13 are connected to the main battery 15 via a common DC link 14. The inverters 11, 12 and 13 convert the direct current power of the main battery 15 into alternating current power, apply it to the motors 1, 4 and 10, and also convert the alternating current power generated by the motors 1, 4 into direct current power the charge the main battery 15.

The controller 16 comprises a microprocessor, and controls the rotation speed of the engine 2, output and torque, transmission torque of the clutch 3, rotation speed and torque of the motors 1, 4 and 10, speed ratio of the CVT 5, and charging/discharging of the main battery 15.

Figure 2:
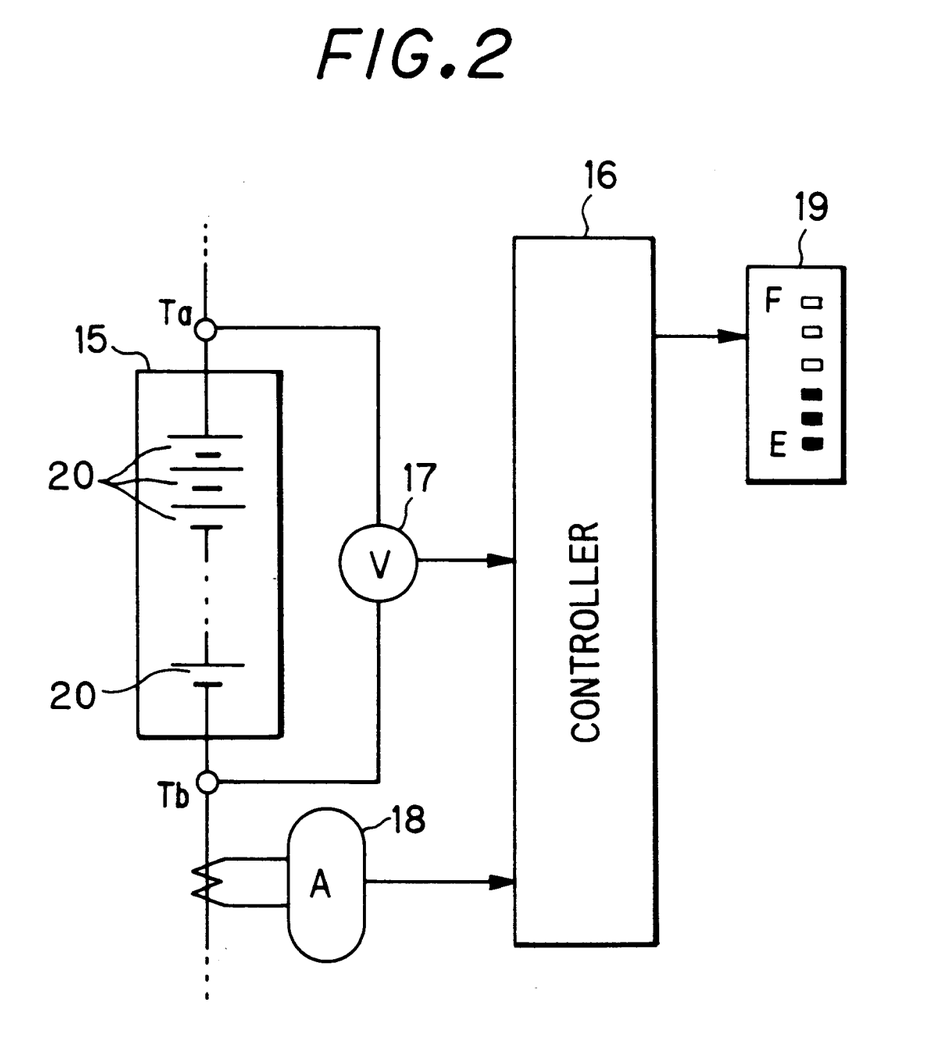
FIG. 2 is a schematic diagram of the SOC indicator.

A voltmeter 17, ammeter 18 and display 19 are connected to the controller 16 as shown in FIG. 2. The voltmeter 17 detects a voltage $V_B$ between the terminals $T_a$, $T_b$ of the main battery 15, and the ammeter 18 detects a charging/discharging current $I_B$ of the main battery 15. The display 19 displays the state of charge (SOC) of the main battery 15.

The main battery 15 is a lithium ion battery to which plural cells 20 are connected in series. The open circuit voltage of the cell 20 is detected as follows.

First, the voltmeter 17 detects the voltage $V_B$ between the terminals $T_a$, $T_b$ of the main battery 15 when charging/discharging of the main battery 15 is not being performed by the inverters 11, 12 and 13. The detected terminal voltage $V_B$ is an open circuit voltage $V_{B0}$ of the main battery 15.

Next, the open circuit voltage $V_{B0}$ of this main battery 15 is divided by a number n of the cells 20, and an open circuit voltage $V_{C0}$ of the cell 20 is found.

$$V_{C0} = V_{B0}/n$$

If the charging/discharging of the main battery 15 stops for only a short time, and the open circuit voltage $V_{B0}$ of the main battery 15 frequently cannot be detected, the terminal voltage when the charging/discharging current $I_B$ is within predetermined limits ($-I_k \leq I_B \leq I_k$) may be taken as the open circuit voltage $V_{B0}$.

Alternatively, a voltmeter may be provided for each cell, and the average value, maximum value or minimum value of these voltages taken as the cell open circuit voltage $V_{C0}$. If the maximum value is chosen, overcharging can be prevented, and if the minimum value is chosen, overdischarge can be prevented.

In order to detect the open circuit voltage $V_{B0}$ of the battery during charging/discharging even more precisely, the terminal voltage $V_B$ and discharge current $I_B$ may be sampled during discharge of the main battery 15, the V-I characteristics of the main battery 15 computed by linear regression analysis of sampled data, and the open circuit voltage $V_{B0}$ estimated. By estimating the open circuit voltage $V_{B0}$ in this way, a precise open circuit voltage $V_{B0}$ of the main battery 15 can be estimated even when charging/discharging of the main battery 15 is performed continuously while the vehicle is running.

SOC=100% and SOC=0% of the battery are defined as follows.

Figure 3:
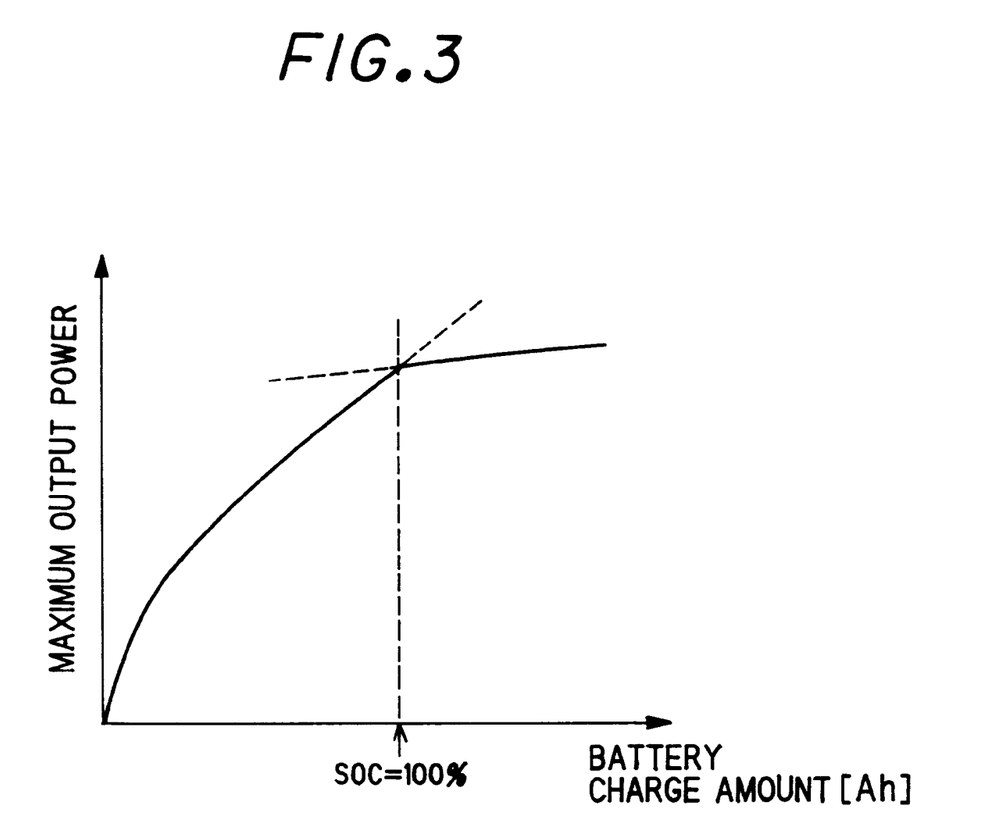
FIG. 3 is a diagram showing the relation of battery charge amount to maximum output power.

FIG. 3 shows the characteristics of maximum output power to battery charge amount. In general, a battery has characteristics such that the maximum output power increases in proportion to charge amount, but when the charge amount exceeds a certain amount, the output power becomes saturated. Here, the battery charge amount when the decrease rate of maximum output power with respect to the decrease of the charge amount varies sharply and exceeds a predetermined decrease rate is defined as SOC=100%. The predetermined decrease rate varies according to the battery type and the materials of the battery, and in for example a lithium ion battery which uses manganese as the cathode and hard carbon as the anode, the predetermined decrease rate is set to approximately 0.5–1.0.

In a lithium ion battery comprising plural cells, a flexion point occurs when the cell open circuit voltage is in the vicinity of 3.9 V, so the capacity when the cell open circuit voltage is 3.9 V is defined as SOC=100%.

Figure 4:
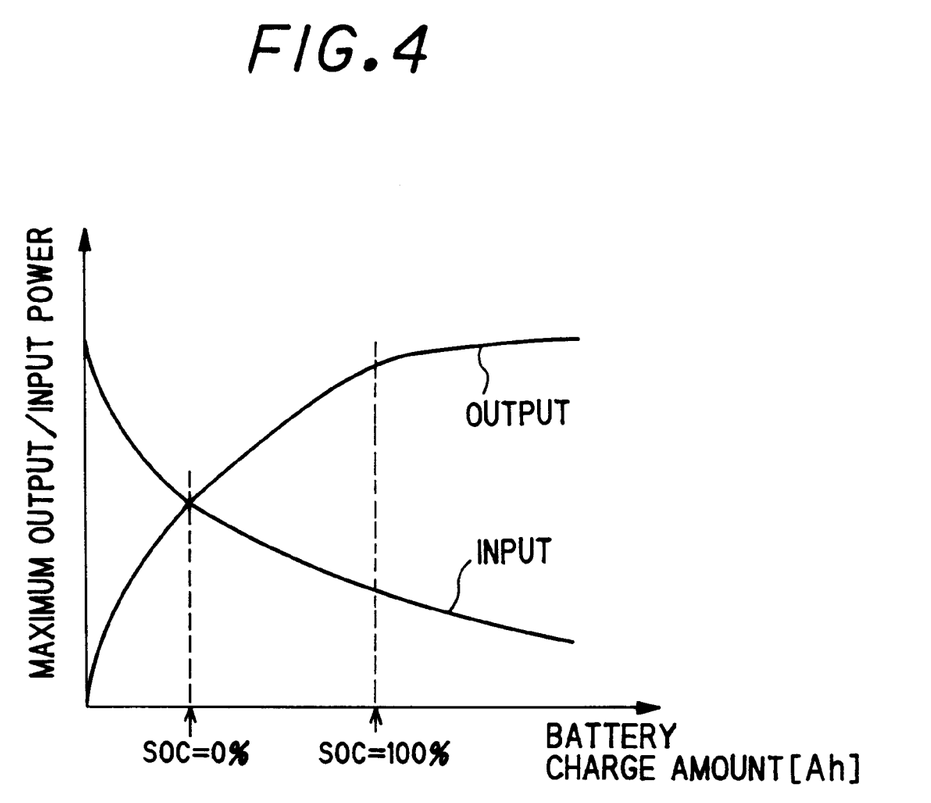
FIG. 4 is a diagram showing the relation of battery charge amount to maximum input/output power.

FIG. 4 shows the characteristics of the maximum output power and maximum input power relative to battery charge amount. In general, in a battery, the maximum output power increases in proportion to the charge amount, and the maximum input power decreases in inverse proportion to the charge amount. Here, the charge amount when the maximum output power and maximum input power are equal is defined as SOC=0%.

In a lithium ion battery comprising plural cells, the maximum input/output powers become equal when the cell open circuit voltage $V_{C0}$ is 3.5 V, so the charge amount when the cell open circuit voltage $V_{C0}$ is 3.5 V is defined as SOC=0%.

Figure 5:
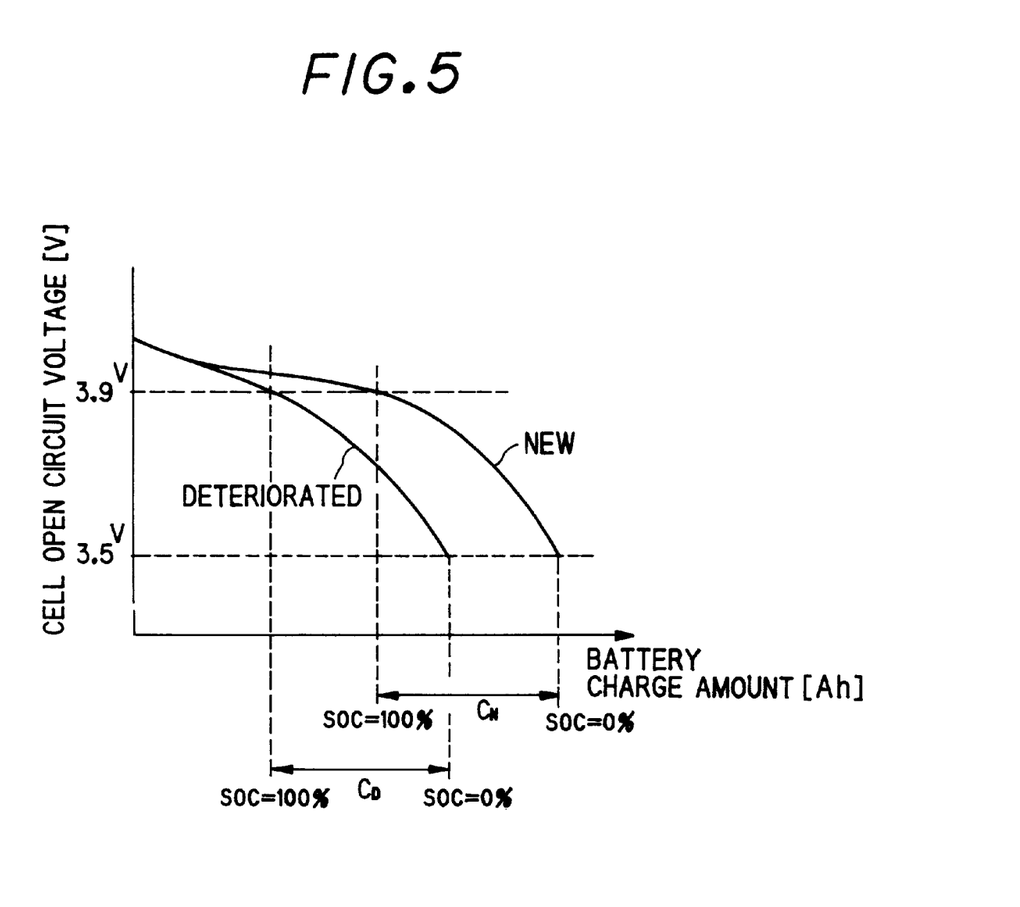
FIG. 5 is a diagram showing the relation of battery charge amount to a cell open circuit voltage.

FIG. 5 shows the battery charge amount-cell open circuit voltage characteristics of a new lithium ion battery and a deteriorate lithium ion battery.

In the new lithium battery, the charge amount when the cell open circuit voltage $V_{C0}$ is 3.9 V is defined as SOC=100%, and the charge amount when the cell open circuit voltage $V_{C0}$ is 3.5 V is defined as SOC=0%. The capacity of the new battery is shown by $C_N$ in the figure.

In a similar fashion, in the lithium ion battery which has deteriorated, the charge amount when the cell open circuit voltage $V_{C0}$ is 3.9 V is defined as SOC=100%, and the charge amount when the cell open circuit voltage $V_{C0}$ is 3.5 V is defined as SOC=0%. The capacity of the deteriorated battery is shown by $C_D$ in the figure.

The SOC between 0% and 100% is computed by defining SOC=100% and SOC=0% as mentioned hereabove, generating a map of SOC-cell open circuit voltage characteristics or a map of SOC-battery open circuit voltage characteristics, and detecting a value relative to the cell open circuit voltage $V_{C0}$ or battery open circuit voltage $V_{B0}$ from these maps.

If SOC=100% and SOC=0% are defined in this way, the capacity $C_N$ of a new battery and the capacity $C_D$ of a battery which has deteriorated become apparently almost equal as shown in FIG. 5 and the apparent capacity no longer decreases even if the battery deteriorates.

Hence, the detected SOC does not become larger than the real SOC even if the battery deteriorates. That is, the proportion of residual amount to the full battery charge amount when in use can be displayed correctly.

Next, the method of computing an SOC higher than 100% will be described.

Figure 6:
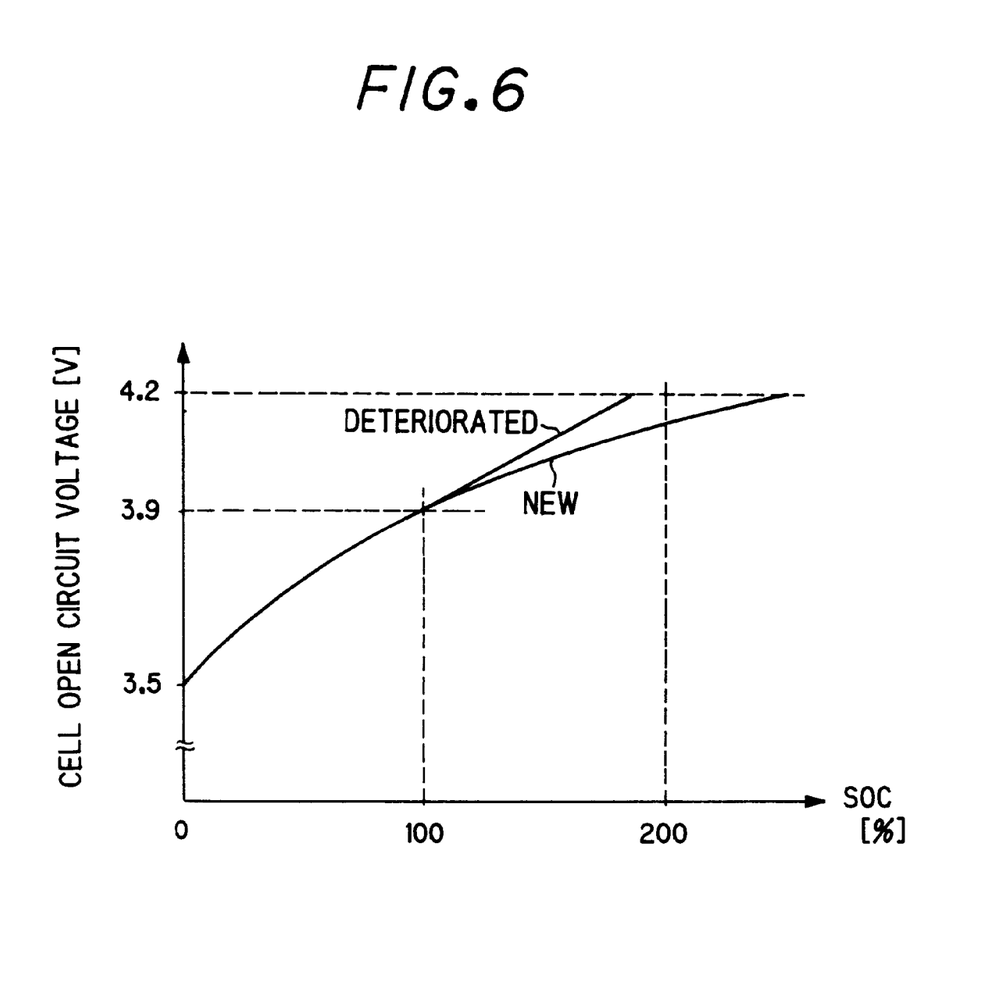
FIG. 6 is a diagram describing a method of computing an SOC higher than 100%.

FIG. 6 shows open circuit voltage characteristics of a new cell and a cell which has deteriorated when the SOC exceeds 100%.

By the definitions of SOC=0%, SOC=100% as mentioned above, there is no difference between a new cell and a deteriorated cell up to SOC=100%.

When the SOC exceeds 100%, which is when the open circuit voltage $V_{C0}$ of the cell exceeds 3.9 V in this case, the SOC can be computed based on the battery charge amount which is computed by integrating the subsequent charging/discharging current $I_B$ of the main battery 15. When the SOC exceeds 100%, a difference arises between a new cell and a deteriorated cell, and the cell open circuit voltage $V_{C0}$ increases with increasing deterioration even for the same SOC.

The precision of the computed SOC as mentioned above depends on the precision with which the ammeter 18 detects a current. As the error increases the higher the computed SOC, a predetermined SOC, e.g., SOC=200%, may be set as an upper limit, and use of the method to compute an SOC higher than this, is avoided.

For batteries of the same type, the SOC-battery open circuit voltage characteristics or SOC-cell open circuit voltage characteristics after the SOC exceeds 100% are the same. Therefore, the SOC-battery open circuit voltage characteristics or SOC-cell open circuit voltage characteristics in the deteriorated state may first be measured, and if the SOC-battery open circuit voltage characteristics or SOC-cell open circuit voltage characteristics when in use coincide with the characteristics in the deteriorated state which were measured beforehand, it may be determined that the battery has deteriorated.

Figure 7:
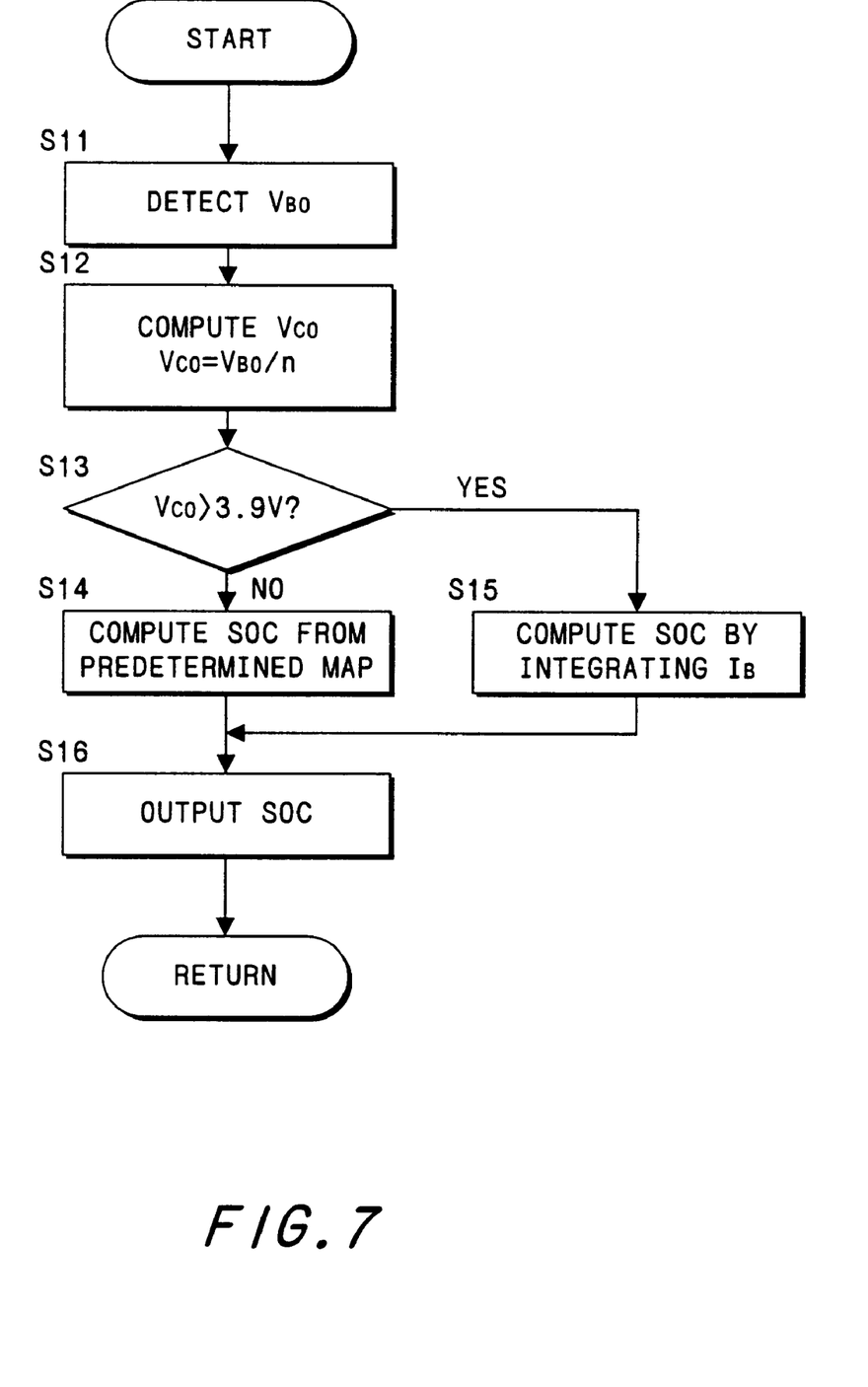
FIG. 7 is a flowchart for describing an SOC calculation process performed by a controller of the SOC indicator.

The details of the SOC detection process performed by the controller 16 are shown in FIG. 7. This flowchart is repeatedly performed at a predetermined interval.

First, in a step S11, the open circuit voltage $V_{B0}$ of the main battery 15 is detected by the voltmeter 17. When charging/discharging of the main battery 15 is performed, the terminal voltage $V_B$ when the charging/discharging current $I_B$ is within predetermined limits is set to the open circuit voltage $V_{BO}$, or the open circuit voltage $V_{BO}$ is estimated by linear regression analysis from the sampled values of the terminal voltage $V_B$ and current $I_B$ during charge/discharge.

In a step S12, the open circuit voltage $V_{CO}$ of a cell 20 is computed from the open circuit voltage $V_{BO}$ by the formula:

$$V_{CO}=V_{BO}/n$$

In a step S13, it is determined whether or not the open circuit voltage $V_{CO}$ of the cell 20 exceeds 3.9 V, i.e., whether or not SOC exceeds 100%. When the open circuit voltage $V_{CO}$ of the cell 20 is equal to or less than 3.9 V, the routine proceeds to a step S14, and when the open circuit voltage $V_{CO}$ of the a cell 20 exceeds 3.9 V, the routine proceeds to a step S15.

In the step S14, the SOC of the main battery 15 is computed by detecting a value relative to the cell open circuit voltage $V_{CO}$ from the SOC-cell open circuit voltage characteristics map which is obtained by defining the battery charge amount when the cell open circuit voltage $V_{CO}$ is 3.9 V as SOC=0% and defining the battery charge amount when the voltage is 3.5 V as SOC=100%.

In the step S15, the battery charge amount is computed by integrating the current $I_B$ detected by the ammeter 18, and the SOC is computed based on this computed battery charge amount.

In the step S16, the computed SOC is output to the display 19.

Figure 8:
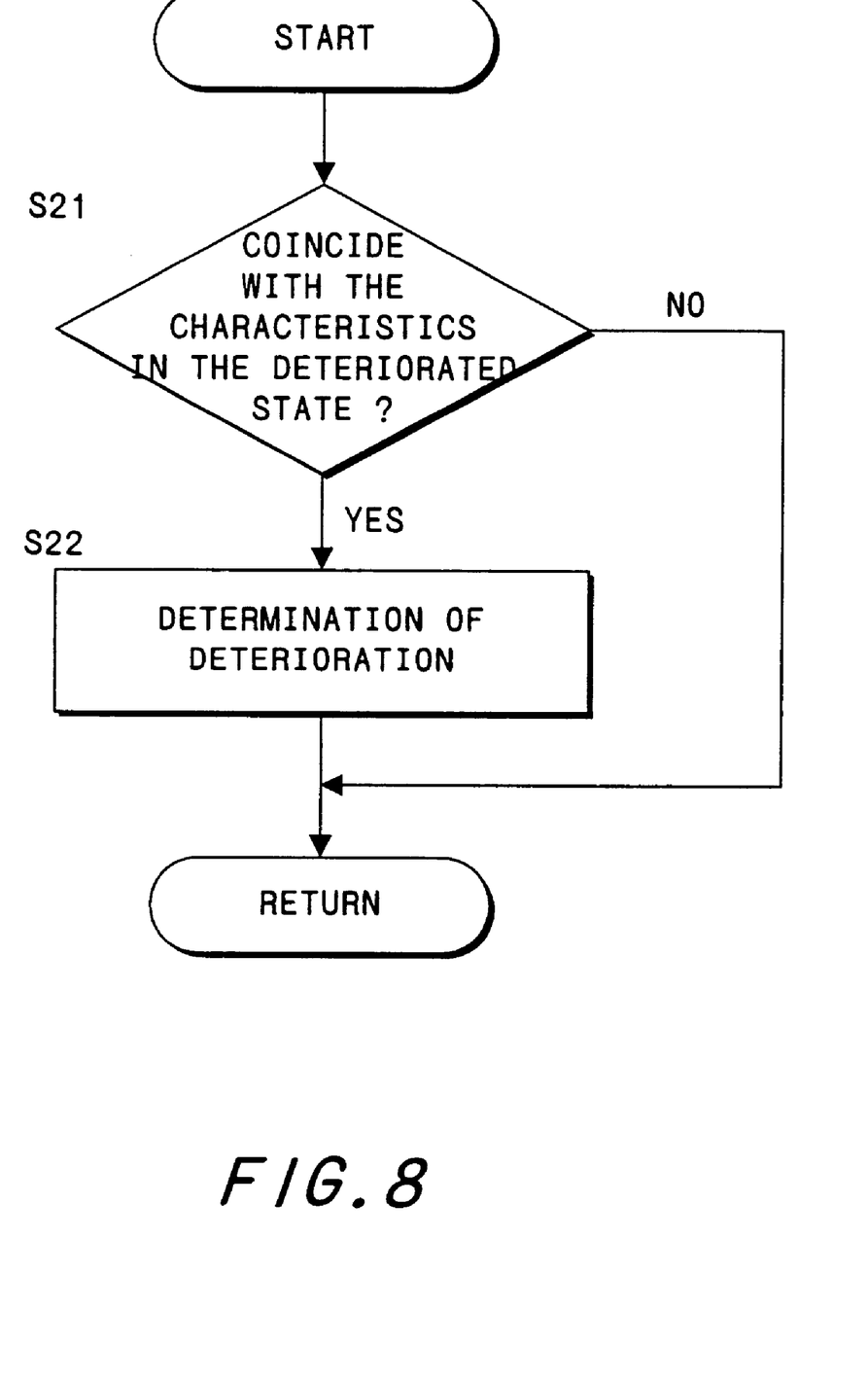
FIG. 8 is a flowchart for describing a deterioration determining process performed by the controller.

FIG. 8 shows the details of the process used for determining deterioration of the main battery 15 as performed by the controller 16. This flowchart is repeatedly performed at a predetermined interval.

First, in a step S21, it is determined whether or not the SOC-cell circuit open voltage characteristics when the SOC is higher than 100%, coincide with the SOC-cell open circuit voltage characteristics in a deteriorated state set beforehand. When these coincide, the routine proceeds to a step S22.

In the step S22, it is determined that the main battery 15 has deteriorated.

Figure 9:
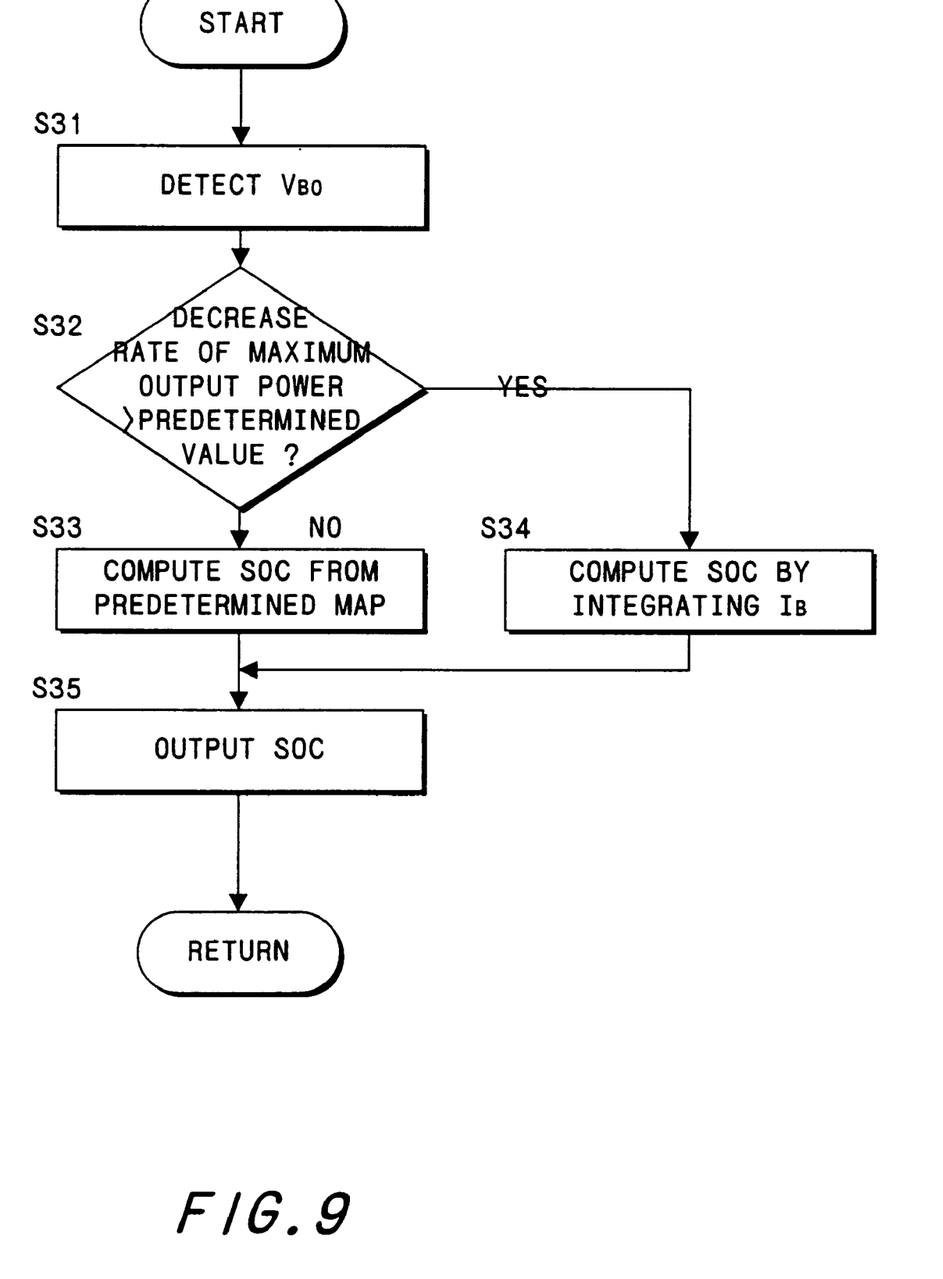
FIG. 9 is similar to FIG. 7, but showing a second embodiment of this invention.

FIG. 9 shows another example of a SOC detection process performed by the controller 16. This flowchart is repeatedly performed at a predetermined interval instead of the flowchart shown in FIG. 7. The difference from the first embodiment is that the SOC is detected based on the battery open circuit voltage $V_{BO}$ of the main battery 15.

First, in a step S31, the open circuit voltage $V_{BO}$ of the main battery 15 is detected by the ammeter 17. When charging/discharging of the main battery 15 is performed, the terminal voltage $V_B$ when the charging/discharging current $I_B$ is within predetermined limits is set to the open circuit voltage $V_{BO}$, or the open circuit voltage $V_{BO}$ is estimated by linear regression analysis from the sampled values of the terminal voltage $V_B$ and current $I_B$ during charge/discharge.

In a step S32, it is determined whether or not the decrease rate of maximum output power exceeds a predetermined value, i.e., whether or not SOC exceeds 100%. When the decrease rate does not exceed the predetermined value, the routine proceeds to a step S33, and when it exceeds the predetermined value, the routine proceeds to a step S34.

In a step S33, the SOC is computed by detecting a value relative to the open circuit voltage $V_{BO}$ from a map of SOC-battery open circuit voltage characteristics obtained by defining the charge amount when the decrease rate exceeds the maximum output power as SOC=100%, and defining the charge amount when the maximum output power and maximum input power are equal to each other as SOC=0%.

In a step S34, the battery charge amount is computed by integrating the current $I_B$ detected by the ammeter 18, and the SOC is computed based on the computed battery charge amount.

In a step S35, the computed SOC is output to the display 19.

Figure 10:
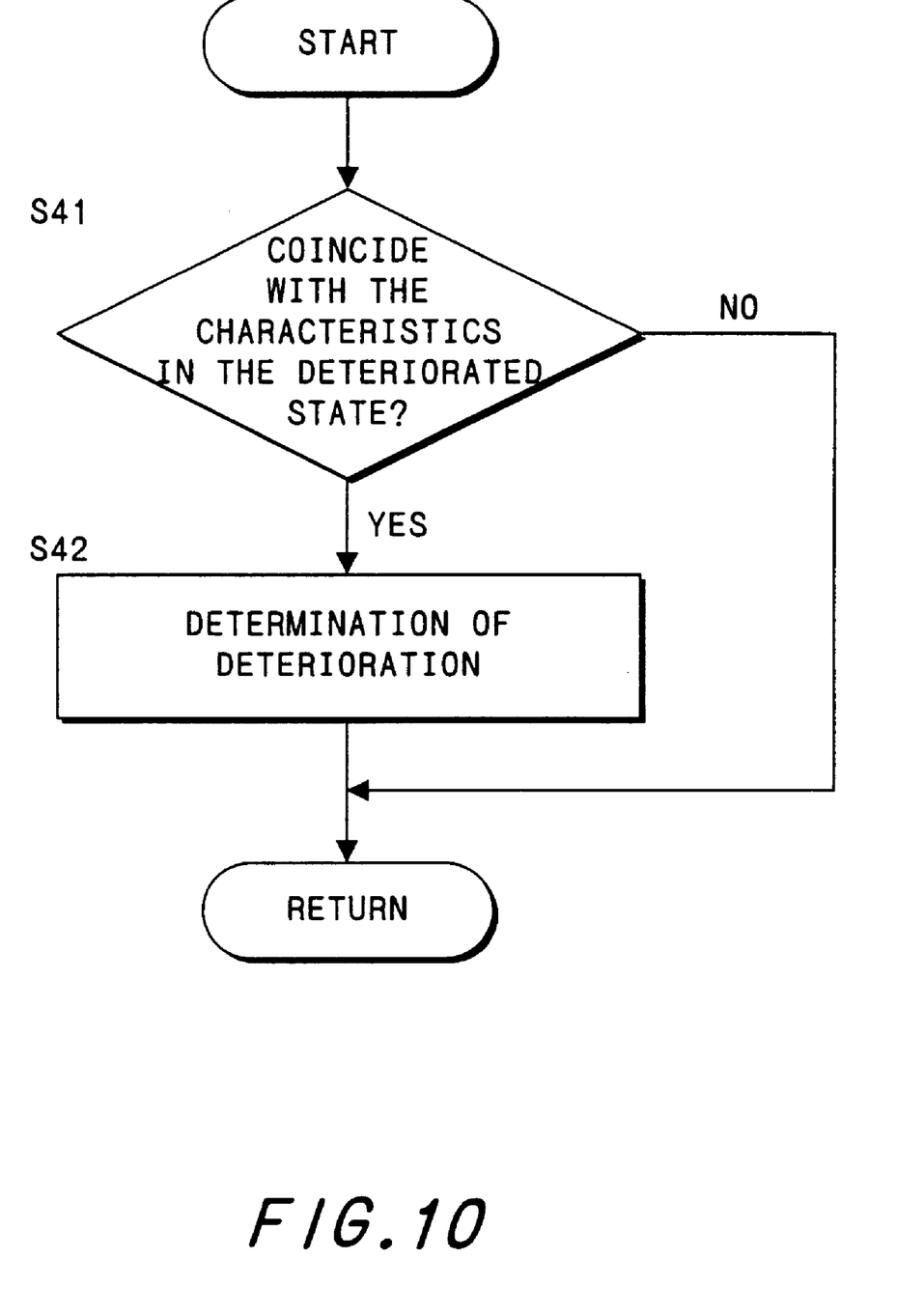
FIG. 10 is similar to FIG. 8, but showing the second embodiment of this invention.

FIG. 10 shows another example of the deterioration determining process of the main battery 15 performed by the controller 16. This flowchart is repeatedly performed at a predetermined interval instead of the flowchart shown in FIG. 8. The difference from the first embodiment is that the deterioration of the main battery 15 is determined based on the SOC-battery open circuit voltage characteristics of the main battery 15.

First, in a step S41, it is determined whether or not the SOC-battery open circuit voltage characteristics when the SOC is higher than 100% coincide with the SOC-battery open circuit voltage characteristics in a deterioration state.

When these coincide, the routine proceeds to a step S42.

In the step S42, it is determined that the main battery 15 has deteriorated.

The entire contents of Japanese Patent Applications P10-132183 (filed May 14, 1998) are incorporated herein by reference.

Although the invention has been described above by reference to certain embodiments of the invention, the invention is not limited to the embodiments described above. Modifications and variations of the embodiments described above will occur to those skilled in the art, in light of the above teachings. The state of charge indicator described above can be used not only for batteries of hybrid vehicles having the above-mentioned construction, but also for batteries of hybrid vehicles of a different construction, batteries of electric vehicles, or batteries of vehicles other than electric vehicles. Moreover, it can be used not only for a lithium ion battery but also for a nickel hydrogen battery or a lithium polymer battery.

The scope of the invention is defined with reference to the following claims.

What is claimed is:

1. A state of charge indicator for a battery comprising plural cells connected in series, the indicator comprising:

a display device;

a sensor which detects an open circuit voltage of the battery;

a sensor which detects a charging/discharging current of the battery; and a microprocessor programmed to:

compute an open circuit voltage of a cell based on the detected battery open circuit voltage;

compute an SOC (state of charge) corresponding to the computed cell open circuit voltage from an SOC-cell open circuit voltage characteristic map obtained by defining the battery charge amount when the open circuit voltage of the cell is a first predetermined voltage as SOC 100%, and defining the battery charge amount when the open circuit voltage of the cell is a second predetermined voltage as SOC 0%, wherein the open circuit voltage of the cell is in a range between the second predetermined voltage and the first predetermined voltage, the second predetermined voltage being set to be lower than the first predetermined voltage;

compute the SOC by integrating the detected charging/discharging current when the open circuit voltage of the cell is greater than the first predetermined voltage; and display the computed SOC in the display device.

2. A state of charge indicator as defined in claim 1, wherein the battery comprises a lithium ion battery and the first predetermined voltage is 3.9 V.

3. A state of charge indicator as defined in claim 1, wherein the battery comprises a lithium ion battery and the second predetermined voltage is 3.5 V.

4. A state of charge indicator for a battery, the indicator comprising:

a display device, a sensor which detects an open circuit voltage of the battery, and a microprocessor programmed to:

computer an SOC (state of charge) corresponding to the detected battery open circuit voltage from an SOC-battery open circuit voltage characteristic map obtained by defining the battery charge amount, when the decrease rate of maximum output power of the battery exceeds a predetermined value, as SOC=100%, and defining the battery charge amount, when the maximum input power and maximum output power of the battery are equal, as SOC=0%, and display the computed SOC on the display device.

5. A state of charge indicator as defined in claim 4, comprising a sensor which detects a charging/discharging current of the battery, wherein the microprocessor is further programmed to compute the SOC by integrating the detected charging/discharging current when the SOC exceeds 100%.

6. A state of charge indicator as defined in claim 4, wherein the microprocessor compares the SOC-battery open circuit voltage characteristics at an SOC higher than 100% with the SOC-battery open circuit voltage characteristics when the battery has deteriorated, and determines that the battery has deteriorated when the two characteristics coincide.

7. A state of charge indicator for a battery comprising plural cells connected in series, the indicator comprising:

a display device;

a sensor which detects an open circuit voltage of the battery; and a microprocessor programmed to:

compute an open circuit voltage of a cell based on the detected battery open circuit voltage;

compute an SOC (state of charge) corresponding to the computed cell upon circuit voltage from an SOC-cell open circuit voltage characteristic map obtained by defining the battery charge amount when the open circuit voltage of the cell is a first predetermined voltage as SOC 100%, and defining the battery charge amount when the open circuit voltage of the cell is a second predetermined voltage as SOC 0%, with the second predetermined voltage being set to be lower than the first predetermined voltage;

display the computed SOC on the display device;

compare the SOC-cell open circuit voltage characteristics at an SOC higher than 100% with the SOC-cell open circuit voltage characteristics in a deterioration state; and determine that the battery has deteriorated when the two characteristics coincide.

8. A state of charge indicator as defined in claim 7, wherein the battery comprises a lithium ion battery and the first predetermined voltage is 3.9 V.

9. A state of charge indicator as defined in claim 7, wherein the battery comprises a lithium ion battery and the second predetermined voltage is 3.5 V.

* * * * *